(12) United States Patent
Xu et al.

(10) Patent No.: US 7,219,412 B2
(45) Date of Patent: May 22, 2007

(54) METHODS OF FORMING TITANIUM-CONTAINING SUPERCONDUCTING COMPOSITIONS

(75) Inventors: Yun Xu, Wexford, PA (US); Stephen P. Turner, Moon Township, PA (US); Mathew S. Cooper, Portersville, PA (US); Wei Guo, Zelienople, PA (US); David B. Love, Butler, PA (US); Edward Cawley, Sewickley, PA (US)

(73) Assignee: Honeywell International Inc., Morristown, NJ (US)

( * ) Notice: Subject to any disclaimer, the term of this patent is extended or adjusted under 35 U.S.C. 154(b) by 457 days.

(21) Appl. No.: 10/860,342

(22) Filed: Jun. 2, 2004

(65) Prior Publication Data

US 2005/0272607 A1 Dec. 8, 2005

(51) Int. Cl.
*H01L 39/24* (2006.01)
(52) U.S. Cl. ............... 29/599; 505/805; 420/417; 420/426; 420/901
(58) Field of Classification Search ............... 505/805; 29/599; 420/417, 426, 901
See application file for complete search history.

(56) References Cited

U.S. PATENT DOCUMENTS 4,808,488 A * 2/1989 Chevrel et al. ............. 428/614
6,024,847 A 2/2000 Rosenberg et al.
6,063,254 A 5/2000 Rosenberg et al.
6,309,595 B1 10/2001 Rosenberg et al.

FOREIGN PATENT DOCUMENTS

JP 60-63334 A2 * 4/1985
JP 61-19743 A * 1/1986

OTHER PUBLICATIONS

Nikulin et al "Superconducting 180 kA NbTi cable", (IEEE Transactions on Applied Supeconductivity, vol. 5, No. 2, Jun. 1995, 889-892.*
Proch et al "Niobium in Superconducitng RF Cavities", International Symposium on Niobium 2001.*
□□Singer et al, "Quality Control for Nb for Tesla Superconducting Cavities", Proceedings of XV Conference on Charged Particles Accelerators, Oct. 22-24, 1996 pp. 127-135.*
Verernikov et al, "An Investigation of Nb-Ti-Ta Alloys . . . ", (IEEE Transactions on Applied Superconductivity) vol. 7, No. 2, Jun. 1997, pp. 1751-1754.*

* cited by examiner

*Primary Examiner*—Mark Kopec
(74) *Attorney, Agent, or Firm*—Wells St. John P.S.

(57) ABSTRACT

The invention includes superconducting titanium-containing compositions having less than 200 ppm, by weight, of a combined total of interstitial materials selected from the group consisting of nitrogen, oxygen, carbon and hydrogen. The invention also includes methods of forming superconducting titanium-containing superconducting compositions containing less than 100 ppm, by weight, of a combined total of interstitial materials selected from the group consisting of nitrogen, oxygen, carbon and hydrogen.

9 Claims, 1 Drawing Sheet

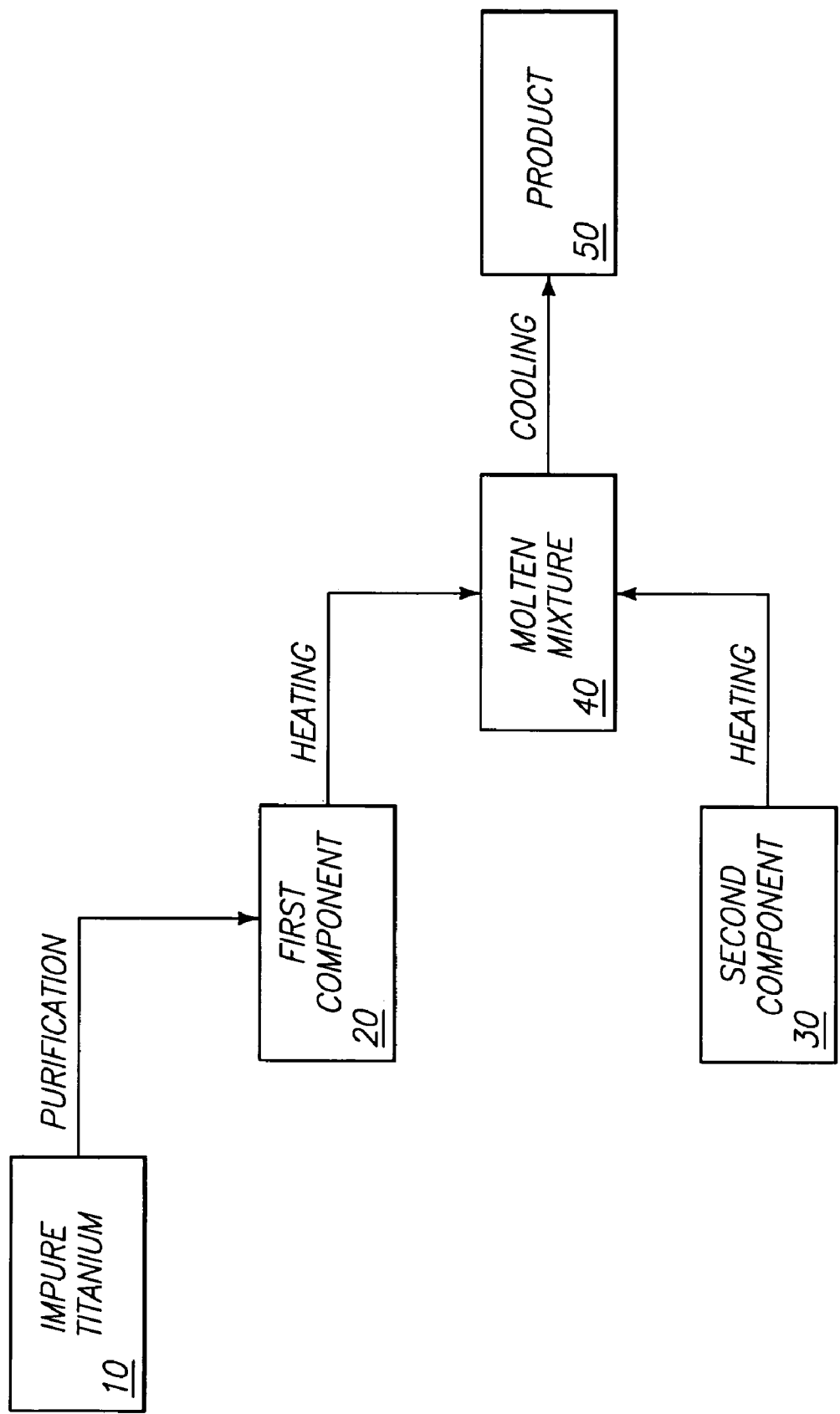

METHODS OF FORMING TITANIUM-CONTAINING SUPERCONDUCTING COMPOSITIONS

TECHNICAL FIELD

The invention pertains to titanium-containing superconducting compositions, and to methods of forming titanium-containing superconducting compositions.

BACKGROUND OF THE INVENTION

Superconducting compositions are defined as compositions which exhibit approximately zero resistivity under appropriate conditions. Conditions which can be pertinent for achieving the approximately zero resistivity can include current density conditions, temperature conditions and external magnetic field conditions. The conditions under which superconducting properties are exhibited can be referred to as critical conditions. Accordingly, a critical temperature of a superconducting material is the highest temperature at which superconducting properties are exhibited, the critical magnetic field is the highest external magnetic field under which superconducting properties are exhibited, etc.

It is frequently difficult to employ superconducting compositions in everyday applications due to the difficulty of achieving the critical conditions under which superconducting properties occur. Accordingly, there is a continuing effort to develop superconducting compositions with relaxed critical requirements.

Among the known superconducting compositions are compositions comprising titanium; such as, for example, compositions comprising niobium and titanium, and compositions comprising niobium, tantalum and titanium. It is desired to develop titanium-containing compositions having improved superconducting properties (such as, for example, relaxed critical current density requirements, relaxed critical temperature requirements, and/or relaxed critical magnetic field requirements), and to develop methodology for forming such titanium-containing compositions.

SUMMARY OF THE INVENTION

In one aspect, the invention includes a superconducting composition comprising titanium and having less than 100 parts per million (ppm), by weight, of a combined total of interstitial materials selected from the group consisting of nitrogen, oxygen, carbon and hydrogen. In particular aspects, the superconducting composition can comprise niobium and/or tantalum in addition to titanium.

In one aspect, the invention includes a method of forming a composition which has superconducting properties under appropriate temperature conditions. A first component of the composition is provided. The first component comprises at least 99.995% titanium and has less than 200 ppm, by weight, of a combined total of the interstitial materials selected from the group consisting of nitrogen, oxygen, carbon and hydrogen. At least one additional component of the composition is provided. The first component and the at least one additional component are incorporated into the composition. The composition has less than 200 ppm, by weight, of a combined total of the interstitial materials selected from the group consisting of nitrogen, oxygen, carbon and hydrogen. In particular aspects, the first component can be formed by electrolytic purification of titanium, and the second component can comprise niobium and/or tantalum.

BRIEF DESCRIPTION OF THE DRAWING

Preferred embodiments of the invention are described below with reference to the following accompanying drawing.

The FIGURE is a diagrammatic, flowchart-type illustration of an exemplary process for forming a titanium-containing superconducting composition in accordance with an aspect of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention pertains to methods of forming titanium-containing superconducting compositions, and to the superconducting compositions themselves. An exemplary superconducting titanium-containing composition is a composition consisting essentially of 47 weight % niobium and the remainder titanium. For purposes of interpreting this disclosure and the claims that follow, a "superconducting composition" is a composition which can attain superconducting properties under appropriate conditions (e.g., when critical density conditions, critical temperature conditions, critical magnetic field conditions, etc. are met). Accordingly, a composition outside of the critical range for achieving superconducting properties is still a "superconducting composition" for purposes of interpreting this disclosure and the claims that follow, provided that the composition is capable of achieving superconducting properties under appropriate critical conditions.

One aspect of the invention is a recognition that the superconducting properties of a titanium-containing composition can be adversely influenced if so-called interstitial materials are present in the composition. Exemplary interstitial materials are nitrogen, oxygen, carbon and hydrogen. The interstitials can adversely impact superconducting properties such as critical current density, critical temperature and critical magnetic field. Accordingly, the invention includes a recognition that it is desired to reduce the levels of interstitial impurities in titanium-containing superconducting compositions in order to improve the superconducting properties of the compositions.

It can be particularly difficult to form titanium-containing superconducting compositions having low contamination with interstitial materials due to the commonplace contamination of commercially pure titanium-containing compositions with various interstitial materials. For instance, if a superconducting composition is formed from niobium and titanium, the niobium will commonly have very low concentrations of interstitial materials (with, for example, 99.99% pure niobium frequently having from about 100 ppm to about 200 ppm of interstitial impurities selected from the group consisting of nitrogen, oxygen, carbon and hydrogen). In contrast, the titanium will frequently have relatively high concentrations of interstitial impurities, with, for example, 99.9% titanium frequently having from about 500 ppm to about 1500 ppm of contamination with one or more interstitial materials selected from the group consisting of nitrogen, oxygen, carbon and hydrogen.

The reported purity level for titanium frequently does not take into account contamination by interstitial materials. For instance, a titanium composition reported as being 99.9% (by weight) titanium can have 0.1% of measured metallic impurities, and several hundred ppm or even several thousand ppm of non-measured interstitial material impurities. The interstitial impurities are frequently not measured and reported in determining the purity of titanium because the interstitial impurities are not considered to negatively impact the titanium for conventional uses. However, as discussed above, one aspect of the present invention is a recognition that interstitial impurities can negatively impact superconducting properties of titanium-containing compositions.

In preferred aspects of the present invention, titanium utilized for incorporation in superconducting compositions has less than 200 ppm, by weight, of a combined total of the interstitial materials selected from the group consisting of nitrogen, oxygen, carbon and hydrogen; less than 100 ppm, by weight, of such combined total; or less than 50 ppm, by weight, of such combined total.

The titanium having reduced interstitial contamination is combined with other appropriate materials to form a superconducting composition. In particular aspects, such superconducting composition can comprise, consist essentially of, or consist of titanium in combination with one or both of niobium and tantalum. An exemplary composition consists essentially of niobium and titanium, with the niobium being present to a concentration of from about 30 weight % to about 70 weight %; in some aspects to a concentration of from about 40 weight % to about 60 weight %; a concentration of from about 45 weight % to about 55 weight %; or a concentration of about 47 weight %.

A superconducting composition formed in accordance with an aspect of the present invention can have less than 200 ppm, by weight, of a combined total of the interstitial materials selected from the group consisting of nitrogen, oxygen, carbon or hydrogen; less than 100 ppm, by weight, of such combined total; or even less than 50 ppm, by weight, of such combined total.

An exemplary superconducting composition formed in accordance with methodology of the present invention can have superconducting properties up to at least a temperature of about 10 kelvin.

An exemplary method for forming a superconducting composition in accordance with an aspect of the present invention is described with reference to the FIGURE.

Initially, impure titanium 10 is provided. The impure titanium comprises an undesired high level of interstitial impurities. For instance, the impure titanium can comprise a combined total of interstitial impurities selected from the group consisting of nitrogen, carbon, oxygen and hydrogen of 200 ppm, by weight, or greater; and in some aspects will comprise greater than 500 ppm, by weight, of such interstitial impurities; or even greater than or equal to 1500 ppm, by weight, of such interstitial impurities. The titanium can also have other impurities in addition to the interstitial impurities.

The impure titanium is subjected to purification to form a first component 20 of a superconducting composition. The first component comprises high purity titanium from which the interstitial materials have been substantially entirely removed, or at least reduced to the desired levels discussed previously in this disclosure. The first component can correspond to, for example, titanium having a purity of at least 99.9 weight %, at least 99.98 weight %, or in particular aspects at least 99.995 weight %.

Exemplary purification of the impure titanium can comprise electrolytic refining, such as, for example, molten salt electrolysis. The electrorefining can comprise one or more of the aspects and procedures described in U.S. Pat. Nos. 6,024,847; 6,063,254 and 6,309,595, all of which are hereby incorporated herein by reference. The electrorefining can form dendritic crystals consisting essentially of titanium, and such crystals can correspond to a feed stock utilized as the first component 20. It is noted that other forms of titanium can be utilized as first component 20. For instance, so-called iodide bars of titanium can be utilized if the titanium has been subjected to iodide purification in addition to, or alternatively to, the electrorefining to form first component 20. However, it can be preferred that the first component correspond to dendritic crystals resulting from electrorefining, in that the dendritic crystals will typically have a much lower concentration of metallic contaminants than other forms of titanium.

A second component 30 of the superconducting composition is provided in addition to the first component. Second component 30 can correspond to, for example, a composition comprising, consisting essentially of, or consisting of niobium. In particular aspects, second component 30 will be niobium having a purity of about 99.99 weight %. Although only one component is shown provided in addition to the first component 20, it is to be understood that multiple components could be provided in addition to first component 20. For instance, the invention encompasses aspects in which a superconducting composition comprises three separate metals (niobium, titanium and tantalum), and accordingly a niobium-containing component and a tantalum-containing component can be provided in addition to the titanium-containing component 20. Generally, at least one additional component will be provided in addition to the first component 20 in the methodology of the FIGURE.

First component 20 and the additional component 30 are heated to form a molten mixture 40. The heating can be conducted with any suitable methodology, including, but not limited to, vacuum arc remelt (VAR), plasma heating, or electron-beam melting. The molten mixture can comprise, consist essentially of, or consist of niobium and titanium in particular exemplary aspects, and in other exemplary aspects can comprise, consist essentially of, or consist of niobium, titanium and tantalum.

The molten mixture is cooled to form a product 50 corresponding to a desired superconducting composition which contains titanium. The product 50 has less than 200 ppm, by weight, of the combined total of the interstitial materials selected from the group consisting of nitrogen, oxygen, carbon and hydrogen; and can correspond to any of the desired compositions discussed previously in this disclosure. Accordingly, the first component 20 and second component 30 have been incorporated into the product 50 having the desired low concentrations of interstitial materials.

The reduction of interstitial impurities in compositions of the present invention relative to prior art superconducting compositions containing titanium can improve superconducting properties of the compositions of the present invention relative to the prior art compositions. Further, the reduction of the interstitial impurities may enhance formation of alpha precipitates and improve a flux pinning effect within the superconducting compositions of the present invention relative to prior art compositions.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a composition which has superconducting properties under appropriate conditions, the method comprising:

provinding a first component of the composition, the first component comprising at least 99.995 weight % titanium and having less than 100 ppm, by weight, of a combined total of interstitial materials selected from the group consisting of nitrogen, oxygen, carbon and hydrogen, wherein the first component is in the form of dendritic crystals consisting essentially of titanium;

providing at least one additional component of the composition; and incorporating the first component and the at least one additional component into the composition, said composition having less than 100 ppm, by weight, of a combined total of interstitial materials selected from the group consisting of nitrogen, oxygen, carbon and hydrogen; wherein the incorporating the first component and the at least one additional component into the composition comprises forming a molten mixture of the first component and the at least one additional component.

2. The method of claim 1 wherein the providing the first component comprises electrorefining to form the dendritic crystals.

3. The method of claim 1 wherein the at least one additional component includes a second component consisting essentially of niobium and a third component consisting essentially of tantalum.

4. The method of claim 1 wherein the at least one additional component is only one additional component and consists essentially of niobium.

5. The method of claim 4 wherein the composition is formed to consist essentially of titanium and niobium.

6. The method of claim 5 wherein the composition comprises from about 30 weight percent niobium to about 70 weight percent niobium.

7. The method of claim 5 wherein the composition comprises from about 40 weight percent niobium to about 60 weight percent niobium.

8. The method of claim 5 wherein the composition comprises from about 45 weight percent niobium to about 55 weight percent niobium.

9. The method of claim 5 wherein the composition comprises less than 50 ppm, by weight, combined total of the interstitial materials selected from the group consisting of nitrogen, oxygen, carbon and hydrogen.

* * * * *